(12) United States Patent
Cheah et al.

(10) Patent No.: US 10,319,698 B2
(45) Date of Patent: Jun. 11, 2019

(54) MICROELECTRONIC DEVICE PACKAGE HAVING ALTERNATELY STACKED DIE

(71) Applicant: Intel Corporation, Santa Clara, CA (US)

(72) Inventors: Bok Eng Cheah, Bukit Gambir (MY); Min Suet Lim, Simpang Ampat (MY); Jackson Chung Peng Kong, Tanjung Tokong (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/354,291

(22) Filed: Nov. 17, 2016

(65) Prior Publication Data

US 2018/0138146 A1 May 17, 2018

(51) Int. Cl.
*H01L 25/065* (2006.01)
*H01L 23/538* (2006.01)
(Continued)

(52) U.S. Cl.
CPC ........ *H01L 25/0652* (2013.01); *H01L 23/481* (2013.01); *H01L 23/5386* (2013.01); *H01L 24/17* (2013.01); *H01L 24/32* (2013.01); *H01L 24/33* (2013.01); *H01L 24/73* (2013.01); *H01L 25/50* (2013.01); *H01L 23/49816* (2013.01); *H01L 23/5383* (2013.01); *H01L 23/5384* (2013.01); *H01L 24/13* (2013.01); *H01L 24/16* (2013.01); *H01L 24/29* (2013.01); *H01L 24/83* (2013.01); *H01L 2224/131* (2013.01); *H01L 2224/13025* (2013.01); *H01L 2224/16146* (2013.01); *H01L 2224/16227* (2013.01); *H01L 2224/1703* (2013.01); *H01L 2224/17181* (2013.01); *H01L 2224/2919* (2013.01); *H01L 2224/32013* (2013.01); *H01L 2224/32014* (2013.01); *H01L 2224/3303* (2013.01); *H01L 2224/33181* (2013.01); *H01L 2224/73204* (2013.01); *H01L 2224/73253* (2013.01);
(Continued)

(58) Field of Classification Search
CPC ....... H01L 2225/06562; H01L 25/0652; H01L 25/0655; H01L 25/0657
See application file for complete search history.

(56) References Cited

U.S. PATENT DOCUMENTS 8,987,896 B2 3/2015 Cheah et al.
9,799,628 B2 * 10/2017 Kim .................. H01L 24/49
(Continued)

OTHER PUBLICATIONS

"International Application Serial No. PCT/US2017/056998, International Search Report dated Jan. 31, 2018", 3 pgs.
(Continued)

*Primary Examiner* — Daniel Luke
(74) *Attorney, Agent, or Firm* — Schwegman Lundberg & Woessner, P.A.

(57) ABSTRACT

A microelectronic device package including multiple layers of stacked die. Multiple die layers in the package can include two or more die. At least two die in a first layer will be laterally spaced from one another to define a first gap extending in a first direction; and at least two die in a second layer will be laterally spaced from one another to define a second gap extending in a second direction that is angularly offset from the first direction. The first and second directions can be perpendicular to one another.

15 Claims, 7 Drawing Sheets

(51) Int. Cl.
  *H01L 25/00* (2006.01)
  *H01L 23/00* (2006.01)
  *H01L 23/48* (2006.01)
  *H01L 23/498* (2006.01)
(52) U.S. Cl.
  CPC ............ *H01L 2224/83102* (2013.01); *H01L 2225/0652* (2013.01); *H01L 2225/06513* (2013.01); *H01L 2225/06517* (2013.01); *H01L 2225/06541* (2013.01); *H01L 2225/06548* (2013.01); *H01L 2225/06562* (2013.01); *H01L 2924/181* (2013.01); *H01L 2924/1811* (2013.01)

(56) References Cited

U.S. PATENT DOCUMENTS

| | | |
|---|---|---|
| 2005/0067694 A1 | 3/2005 | Pon et al. |
| 2008/0150111 A1 | 6/2008 | Hiller et al. |
| 2010/0109139 A1 | 5/2010 | Lee |
| 2012/0074546 A1* | 3/2012 | Chong ................. H01L 21/561 257/676 |
| 2012/0168967 A1 | 7/2012 | Huang et al. |
| 2013/0187292 A1* | 7/2013 | Semmelmeyer .... H01L 25/0652 257/777 |
| 2014/0203457 A1* | 7/2014 | Kim ....................... H01L 25/18 257/778 |
| 2015/0243631 A1 | 8/2015 | Haba et al. |
| 2016/0172331 A1 | 6/2016 | Yu et al. |
| 2016/0315071 A1 | 10/2016 | Zhai et al. |
| 2017/0207197 A1* | 7/2017 | Yu ......................... H01L 23/481 |

OTHER PUBLICATIONS

"International Application Serial No. PCT/US2017/056998, Written Opinion dated Jan. 31, 2018", 6 pgs.

\* cited by examiner

FIG. 8 ical Field

Embodiments described herein relate generally to microelectronic devices having stacked die structures, and more specifically relate to microelectronic devices having stacked die arranged in alternating orientations, and the methods of forming such microelectronic devices.

BACKGROUND

Microelectronic devices such as IC (integrated circuit) packages can include multiple layers of stacked semiconductor die ("die") vertically placed on top of one another, with the stacked die, in many examples, supported on a package substrate. In conventional stacked die configurations, the multiple die will typically be stacked directly on top of one another. In some cases, the die may be stacked in terms of decreasing dimensions, so that each higher die fits within the available area of the die below. In other conventional packages multiple essentially identical die may be stacked directly on top of one another; and in some cases can be interconnected through silicon vias ("TSVs"), to communicate with a supporting substrate below. In these types of packages, where the size and configuration of the die used in the package is limited by the stacking constraints, that limitation provides a barrier to integration of different die types and sizes into the IC package.

A common problem with such stacked die IC packages is that conventional die stacking provides limited capability for thermal dissipation, leading to heat accumulation and/or entrapment within the package. Such heating can lead to premature failure, or degradation of reliability of one or more of the die within the package due to e.g. increased device junction temperature (Tj). This becomes a particular problem as many packages seek to combine multiple "ultra-thin" die (e.g., die having a thickness at or less than 100 μm), in a package. Some such "ultra-thin" die may have a thickness ranging 20 μm to 100 μm. Additionally, many packages seek to combine devices of different types, such as, for example, processors, memory (such as, for example, flash memory or dynamic random-access ("DRAM") memory), radio frequency ("RF") devices, and other types of analog, digital, and/or mixed-signal devices. In various embodiments such combined devices will often have different degrees of heat sensitivity (in terms of failure or degradation) and heat generation. Additionally, some types of devices, for example processors, may have regions that are particularly thermally-active-regions in which substantially greater heat is generated than in other regions of the device.

Conventional attempts to mitigate the described heating problems include thermal interface materials, thermally conductive encapsulant for the package (to assist in transferring heat out of the package), and various forms of heat spreading structures. These thermal management materials can add cost to the package, and can often be of less than optimal utility in their ability to transfer heat trapped between stacked ICs.

As a result, it would be beneficial to provide a structure for stacked die microelectronic device packages that would facilitate greater flexibility in integration of multiple die into the stacked package, and/or that would better facilitate dissipation of heat generated by one or more of the stacked die in the package.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The present description addresses several example embodiments of a microelectronic package containing stacked die arranged in alternating orientations. For example, a microelectronic device package can have a support structure, such as a substrate which supports multiple layers of stacked die. For purposes of the present description, the term "substrate" will be used to refer to any form of structural element which supports the described stacked die. In many cases the recited "substrate" will be the device package substrate that provides interconnection with structures or system external to the described microelectronic device. Thus, the term is used to be include a substrate component internal to the device package, as is often termed an "interposer." In some examples, each die layer in the package can include two or more die. In one example configuration, the substrate can support first and second die arranged in laterally spaced relation to one another to define a first gap extending in a first direction. Third and fourth semiconductor die can extend over the first and second die, with the third and fourth semiconductor die also in laterally spaced relation to one another to define a second gap extending in a second direction that is at an angle to the direction of the first gap. In many examples, the second direction will be perpendicular to first direction.

In many examples, the first and second die can be supported directly by the substrate; while in other examples the described stacked die could be stacked above another die in the microelectronic package. As a result, while the embodiments described and depicted herein are representative examples, in other examples, the stacked die could be stacked on top of another semiconductor die in place of the substrate as described herein.

Figure 1A:
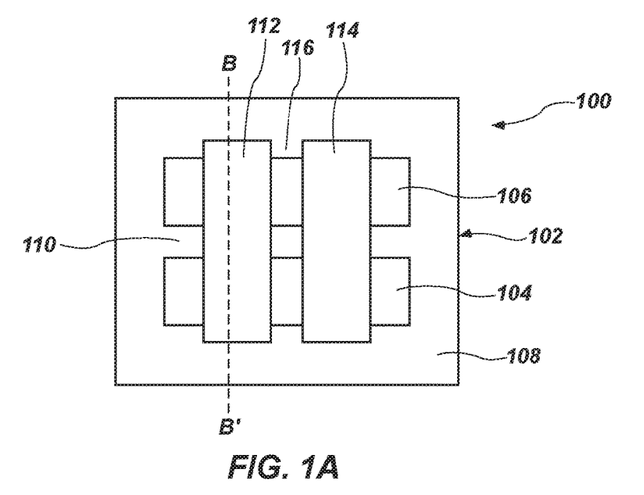
FIGS. 1A-B depict the schematic representation of an example microelectronic device package; depicted in FIG. 1A from a top view; and in FIG. 1B from a side view.
Figure 1B:
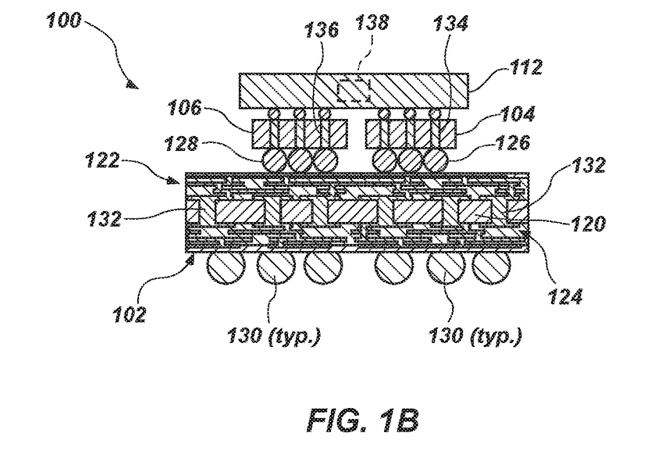

Referring first to FIGS. 1A-B, FIG. 1A depicts a top view schematic representation of an example microelectronic device package 100; and FIG. 1B depicts a cross-sectional representation of package 100 from a side view along line B-B' in FIG. 1A. Example package 100 includes a substrate, indicated generally at 102, with an upper surface 108. Supported on substrate are a first pair of semiconductor die 104 and 106. Die 104 and 106 are arranged in laterally spaced relation to one another to define a gap 110 extending between the die 104, 106. Gap 110 extends in a first direction, essentially perpendicular to line B-B'. A second pair of die 112 and 114 extend over each of die 104 and 106. Die 112 and 114 are again in laterally spaced relation to one another to define a gap 116 between the die. In many examples, each pair of die will be cooperatively arranged such that the direction of the first gap 110 is angularly disposed relative to a second gap of another layer of die, in many cases a layer of die directly above or below (i.e., vertically adjacent) die 112 and 114. In many examples, the die will be arranged such that the first and second gaps, 110 and 116, respectively, will extend generally perpendicularly to one another.

Referring now to FIG. 1B, there is depicted a cross-sectional representation of device package 100 along line B-B' in FIG. 1A. The substrate of the package as described herein can be of any desired construction and configuration. In the depicted example configuration, the substrate 102 includes a central core 120 with redistribution structures, indicated generally at 122 and 124, on opposite sides of central core 120. Redistribution structures 122 and 124 include one or more layers of conductors, insulated from one another, to establish conductive paths between desired locations. For example, upper redistribution structure 122 will have bond pads configured to engage contact structures, such as solder balls 126, 128 (without implying any particular material of the "balls"), on first and second die 104, 106, respectively. Similarly, lower redistribution structure 124 will establish conductive paths extending to bond pads having contact structures again, such as solder balls, indicated typically at 130. Vertically extending contacts, for example such as plated through hole (PTH) vias, indicated typically at 132, will be provided to establish electrical communication between specific conductors within redistribution structures 122 and 124.

In the depicted example, the lower pair of semiconductor die 104, 106 are configured with sets of vertical interconnects, 134, 136, respectively, configured to provide electrical communication between one or more of semiconductor die 112, 114 extending above. In many examples, vertical interconnects 134, 136 will be in the form of through silicon vias (TSVs).

Semiconductor die 104, 106, 112, 114 can be of any desired types for the package. As one example configuration, semiconductor die 112 can be a processor, and one or both of die 104, 106 in the lower level could be memory devices. An additional option for thermal management in example package 100 can be achieved in the spacing and the positioning to define the gaps 110 and 116. Some types of devices can have thermally active regions, or "hotspots," providing regions of localized heating. An example such region is indicated at 138 in semiconductor die 112. Such a thermally active region can be found in many types of devices, though various forms of processors may be particular examples exhibiting the phenomena. In the depicted example, die 112 is mounted on die 104 and 106 such that thermally active region 138 is located above gap 110, which can provide a path for heat to be moved away from die 112 without being trapped by the die below. Additionally, the multiple die in package 100 may be cooperatively configured to configure the lateral dimensions of gap 110, as well as its placement relative to thermally active region 138. In some examples the same configuration methodology can be applied to adjusting the placement and configuration of gap 116 relative to the die below (104, 106).

Figures 2A, 2B:
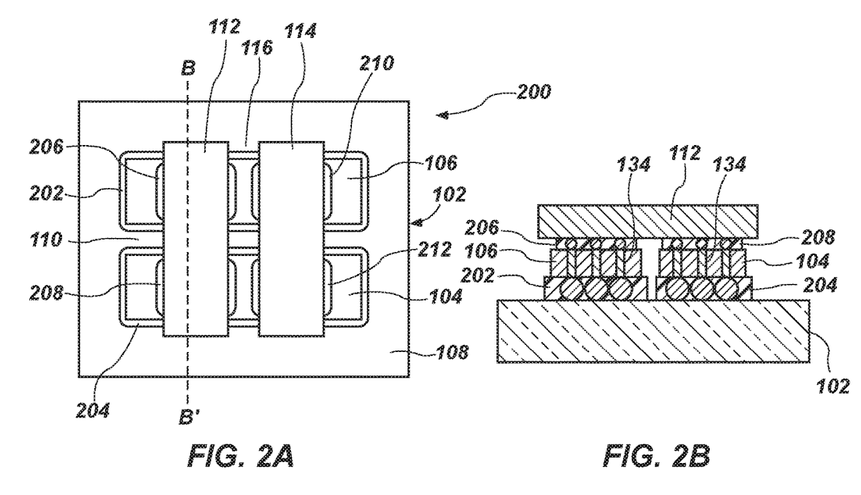
FIGS. 2A-B depict schematic representations of the example microelectronic device package of FIGS. 1A-B including additional optional structure; depicted in FIG. 2A from a top view; and in FIG. 2B from a side view.

Referring now to FIGS. 2A-B, those figures depict an example package configuration 200 in which the example package 100 of FIGS. 1A-B includes one form of an additional retention material applied beneath die 104, 106, in between those die and the upper layer of die 112, 114. In the depicted example, the additional retention material is in the form of underfill 202, 204 beneath die 104, 106; and underfill 206, 208, 210, 212 between each of die 104, 106 and die 112, 114. The underfill can be of any desired form, as known to persons skilled in the art. For example a capillary underfill material is one suitable example. In many examples, the retention material, such as the described underfill, can include one or more of epoxy resins (e.g. polyepoxides), polyimides, polyamides and/or polyesters.

Figures 3A, 3B:
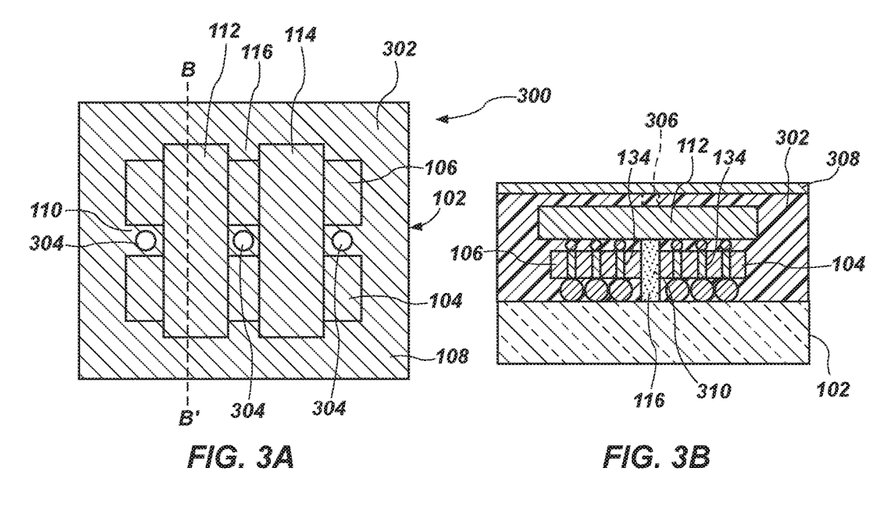
FIGS. 3A-B depict schematic representations of the example microelectronic device package of FIGS. 1A-B including additional optional structure; depicted in FIG. 3A from a top view; and in FIG. 3B from a side view.

Referring now to FIGS. 3A-B, those figures depict an example package configuration 300 in which the example package 100 of FIGS. 1A-B includes an alternative form of an additional retention material applied. In the depicted example, the structure of package 100 is retained within an encapsulant 302. In some examples, encapsulant 302 can extend completely around each of die 104, 106, 112, 114. However in other examples, to further facilitate the thermal management, it may be desirable to leave an open region 304 extending within at least a portion of one (or more) of gaps 110, 116. In some examples, open region 304 may connect with the environment external to package 300, as depicted in FIG. 3A. For example, FIG. 3B depicts (in phantom, at 306), an aperture (304 as shown in FIG. 3A) that is beyond the plane of the cross-section. The aperture identified at 306 will be in communication with gap 310 below. In some examples the open region 304, or some portion thereof, may be filled with a thermally conductive interface material, such as a thermal paste or other thermally conductive material as known in the industry, to allow additional thermal transfer capability.

Additionally, FIG. 3B depicts an optional structure of a thermal distribution structure, indicated at 308. In the depicted example, the thermal distribution structure 308 includes a layer 308 configured to serve as a heat spreader, such as a metallic layer. In other examples, a thermally conductive material within openings 304 might be placed in thermal communication with and encasing surface of the device package, or a metallic surface exterior to the device package, to facilitate heat transfer away from openings 304. In other examples, the thermal distribution structure 308 might include a heat pipe, as known for facilitating the removal of heat from a surrounding region.

In some examples, underfill as depicted in package 200 of FIGS. 2A-B can be used in combination with an encapsulant in some form, as discussed in reference to package 300. The encapsulant can again be any one or more of epoxy resins (e.g. polyepoxides), polyimides, polyamides and/or polyesters.

Figure 4A:
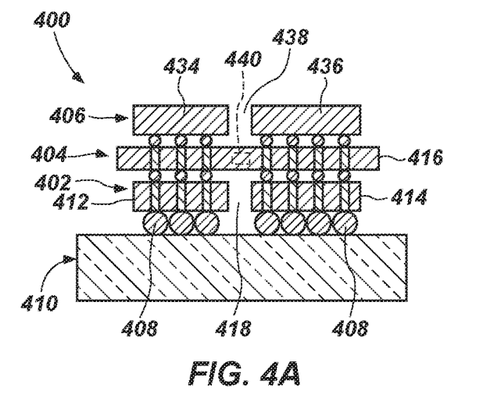
FIGS. 4A-D depict schematic representations of another example microelectronic device; depicted in FIG. 4A from a side view; depicted in FIG. 4B from another side view orthogonal to the view of FIG. 4A; depicted in FIG. 4C from a top view with the uppermost layer in phantom; and in FIG. 4D along line D-D of FIG. 4B.
Figure 4B:
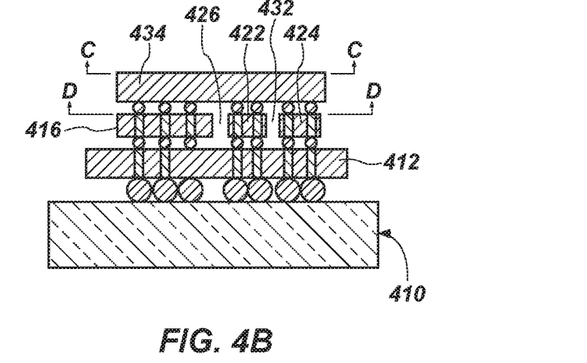
Figure 4C:
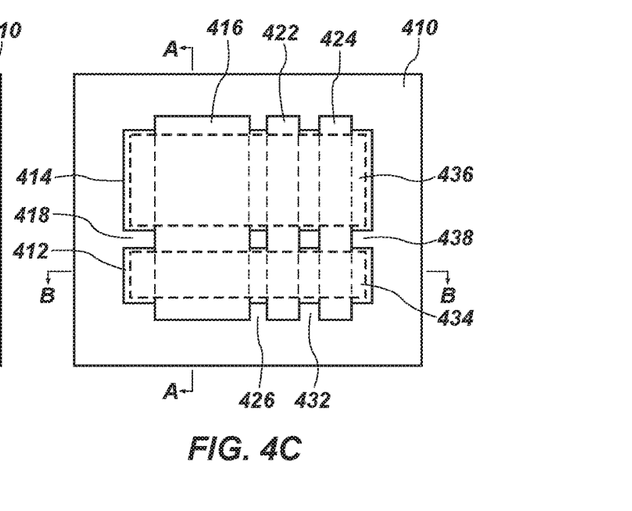
Figure 4D:
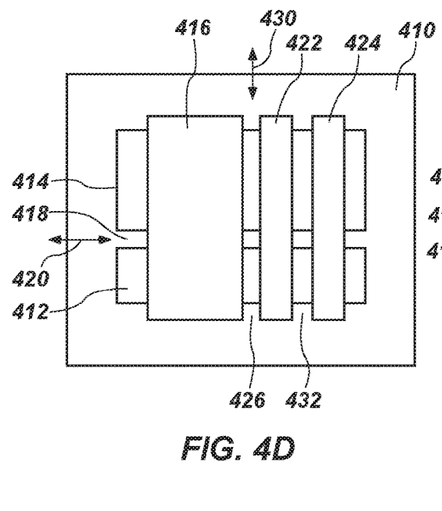
Figure 5:
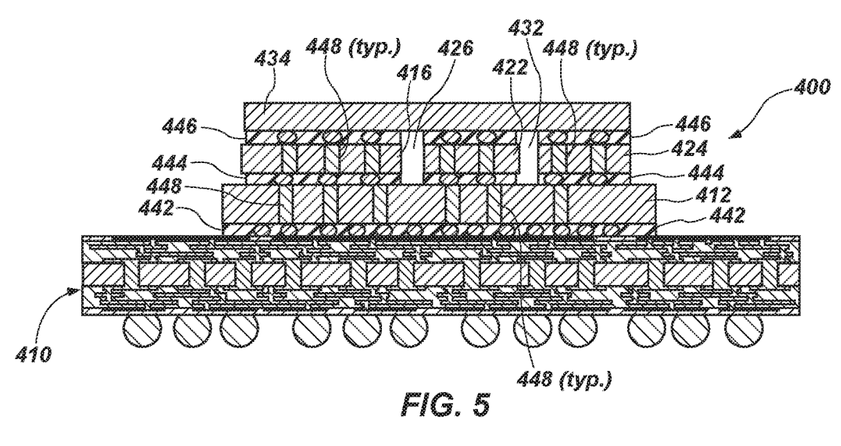
FIG. 5 depicts a schematic cross-sectional representation of the device of FIGS. 4A-D, from the direction of FIG. 4B, with additional optional structure.

Referring now to FIGS. 4A-D and FIG. 5, therein are depicted schematic representations of an alternative configuration of an example package 400, illustrated in FIGS. 4A-B in side cross-sectional views rotated 90° relative to one another; and in FIG. 4C from a top view along plane C-C in FIG. 4B with the uppermost layer of die in phantom, and in FIG. 4D along a plane D-D in FIG. 4B. Package 400 has some similarities to package 100 of FIGS. 1A-B, with the exceptions that package 400 includes three layers of semiconductor die, indicated generally at 402, 404, and 406, and level 404 includes three die. In the depicted example, the lower die layer 402 includes contact balls, such as solder balls, indicated generally at 408, coupled to substrate 410. Substrate 410 can be any desired construction and configuration known in the art. FIG. 5 depicts a vertical section of an example substrate structure which is directly analogous to that discussed relative to substrate 102 of FIG. 1B and thus will not be described again here.

In this example, lower die layer 402 includes two die 412, 414. As discussed relative to example package 100 of FIG. 1, the two die of lower die layer 402 are in laterally spaced relation to one another to define a gap, indicated generally at 418, extending in a first direction, as indicated by arrow 420.

The vertically adjacent die layer 404 (above lower die layer 402), includes three die 416, 422 and 424. Laterally adjacent die 416 and 422 define a first gap 426 extending in a second direction, as indicated by arrow 430. Additionally, laterally adjacent die 422 and 424 are in spaced relation to define gap 432. Gap 432 extends parallel to gap 426, in the second direction 430. In the depicted example, direction 420 of first gap 418 of lower die level 402 is essentially perpendicular to direction 430 of gaps 426 and 432.

Package 400 then includes two die 434 and 436 in uppermost die layer 406. Die 434 and 436 are again in spaced relation to one another to define a gap 438 extending in the first direction 420.

As can be seen in the figures, the three die of layer 404 (416, 422, 424) extend across both die 412, 414 of the vertically adjacent lower die layer 402 (412, 414). In many examples, each of die 416, 422, 424 will be coupled to both die 412, 414. Similarly, in many examples each die of layer 406 (434, 436) will be coupled to each of the die in the vertically adjacent layer below (here, intermediate layer 404 (die 416, 422, 424). In many examples, one or more of the die in each of layers 404 and 406 will be coupled to the substrate through vertical interconnects in the die below. In many examples, these vertical interconnects will include TSVs (indicated typically at 448 in FIG. 5) in a manner analogous to that discussed in reference to FIGS. 1A-B. In the depicted structure it can be seen that signals to or from the die of the uppermost layer 406 need only traverse the vertical distance through the die of the two layers below (404, 402) to reach the substrate. As a result, the signal path to the substrate is reduced relative to if all of the seven die of this example configuration were vertically arranged relative to one another.

Again, the die included in example package 400 can be of any types desired. As can be seen from the depiction of package 400, the techniques described herein facilitates stacking die of different dimensions and configurations, thereby avoiding restrictions present in some prior art configurations. The ability to accommodate different die dimensions facilitates increased options for device integration into a stacked die package.

Additionally, as discussed above, the stacked die can be arranged so that a die having a thermally active region, such as that indicated at 440 in die 416 in intermediate die layer 404, is not sandwiched directly adjacent another die. As shown in package 400, the die of lower die layer 402, and also of upper die layer 406 are arranged such that the respective gaps 418 and 432, in lower die layer 402 and upper die layer 406, respectively, are placed to lie below and above thermally active region 440. In this configuration, heat may be dissipated from thermally active region 440 to both sides of die 416. As noted previously relative to example package 100, at least one of the die in package 400 may be a processor; and in some examples the processor could be arranged in an intermediate layer, so as to benefit from the above heat dissipation capability.

Additionally, in package 400, one or more die in each of die layers 402, 404, 406 may be memory devices. Additionally, in some examples one of the semiconductor die may be a bridge device providing interconnects between two other die in another die layer(s). As one illustrative example, using the structure of package 400 for illustration, die 424 in intermediate layer 404 may be a bridge device. In such examples the bridge device of die 424 could provide direct interconnects between two die in vertically adjacent layer, for example between die 412 and 414 in die layer 402, or between die 434, 436 in upper die layer 406. In other examples, a bridge device such as die 424 can provide direct interconnects between a die in a vertically adjacent layer below (such as either, or both, of die 412 and 414 in die layer 402), and a die in a vertically adjacent layer above (such as either, or both, of die 434, 436 in upper die layer 406).

As depicted in FIG. 5, a retention material as discussed above can be utilized between all or selected die and the die were substrate below. In the depicted example, underfill has been placed between the substrate and lower die level 402, as indicated generally at 442; between the die of the intermediate layer 404 and of the lower die level 402, as indicated generally at 444; and between the die of the upper die layer 406 and of the intermediate die layer 404, as indicated generally at 446. As noted previously, with respect to the example of package 300 of FIGS. 3A-B, an encapsulant may also be used instead of, or in combination with, the depicted example underfill.

Figure 6:
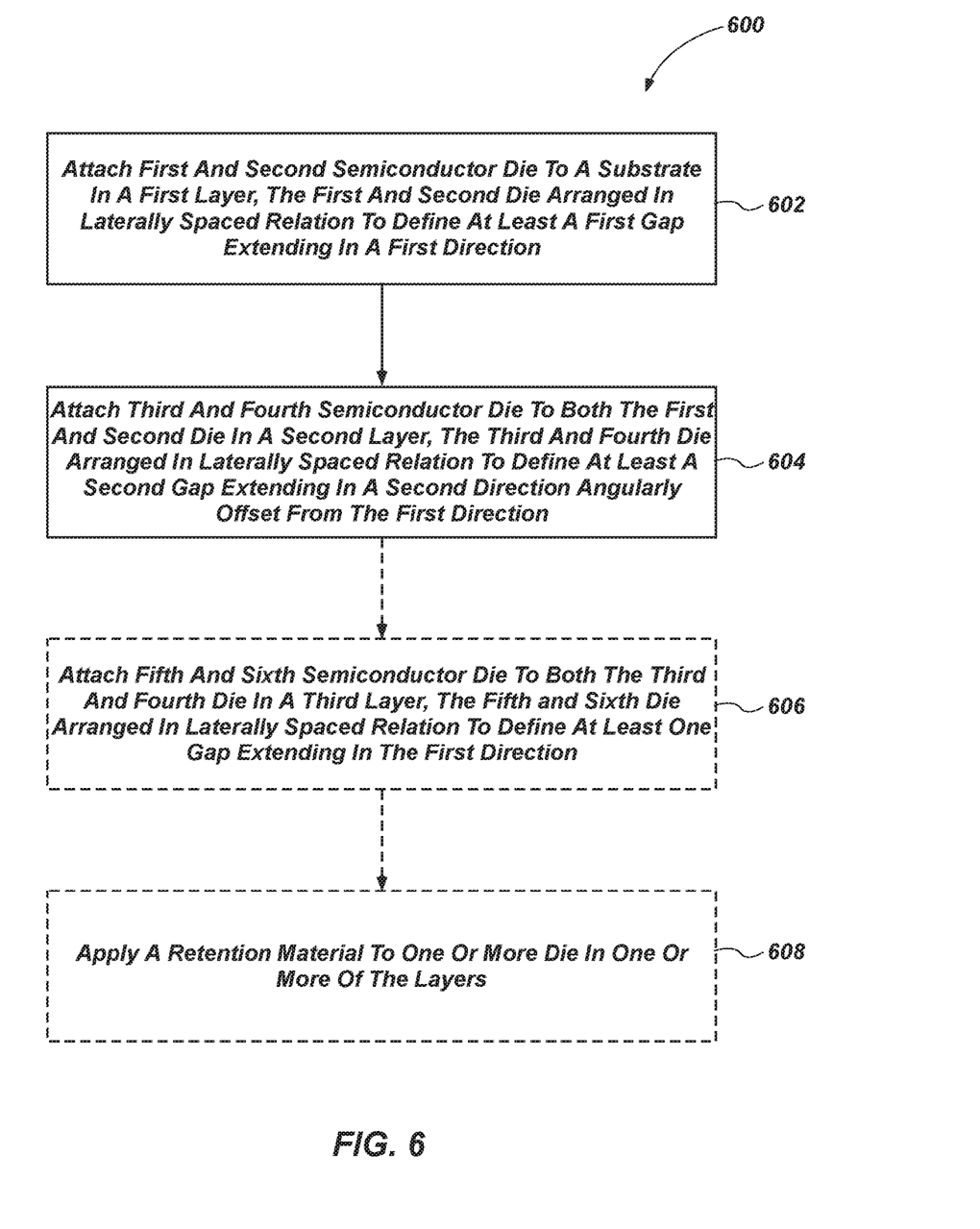
FIG. 6 is a flow chart depicting an example process for forming a microelectronic device as described herein.

Referring now to FIG. 6, the figure depicts a flowchart of an example process 600 for forming a stacked die microelectronic device package as described herein. As indicated at 602, first and second semiconductor die are attached to a substrate in a first layer, with the first and second die arranged in laterally spaced relation to one another to define at least a first gap extending in a first direction. In many examples, attaching the first and second semiconductor die to the substrate includes establishing both mechanical and electrical connections between the die and the support structure.

In many examples, the substrate will be in the form of a substrate configured to provide interconnection with structures outside the device package. In other examples, however, the substrate to which the first and second die are attached may be an interposer between the stacked die and a device package substrate. For purposes of describing the method, the references to "first," "second," "third," die. etc. are provided purely for clarity of the description, and do not indicate any restriction on the number of die in each die layer. Any die layer may include additional die beyond those identified through the numerical references.

As indicated at 604, third and fourth semiconductor die are then attached to both the first and second die in a second die layer; with the third and fourth die also arranged in laterally spaced relation to define at least a second gap extending in a second direction angularly offset from the first direction (see, for example, FIG. 1A). As discussed previously herein, in many examples, the second direction will be perpendicular to the first direction of the gap of the first die layer.

In many examples, attaching the third and fourth semiconductor die to the first and second die includes establishing mechanical and electrical connections between the die of the two die layers. As described previously, in many examples, at least one of the first and second die will include vertical interconnects (which may include structures such as TSVs), facilitating direct electrical connection between one or more of the third and fourth die and the substrate. In examples as described herein, in which there is another layer of die above the third and fourth die, vertical interconnects in at least one of the third and fourth die will provide electrical connections to at least one of the first and second die, and through vertical interconnects in those die to the substrate.

As indicated at 606, optionally, to form some example device packages, fifth and sixth semiconductor die will be coupled to both the third and fourth die in a third die layer; with the fifth and sixth die again arranged in laterally spaced relation to define at least one gap extending in the first direction (see, for example, FIGS. 4A-D and 5). In other examples, the fifth and sixth semiconductor die may be arranged to define a gap extending in another direction that is angularly offset at an angle different from 90° relative to the first and/or the second directions.

In the method, the die arranged as described above can be of any selected types and arrangement, including, but in no way limited to, any of the optional configurations both as to device type and placement discussed in reference to FIGS. 1-5. Additionally, the method can include arranging the die of two adjacent die layers such that a gap between die defined in a first of such layers is provided vertically adjacent at least one thermally active region of a die in the other of such layers.

As indicated at 608, again optionally, to form some example device packages, a retention material may be applied to one or more die in one or more of the die layers. As discussed previously herein, this retention material can include an underfill material (see, for example, FIGS. 2A-B and 5); or in other examples can include an encapsulant (see, for example, FIGS. 3A-B).

Figure 7A:
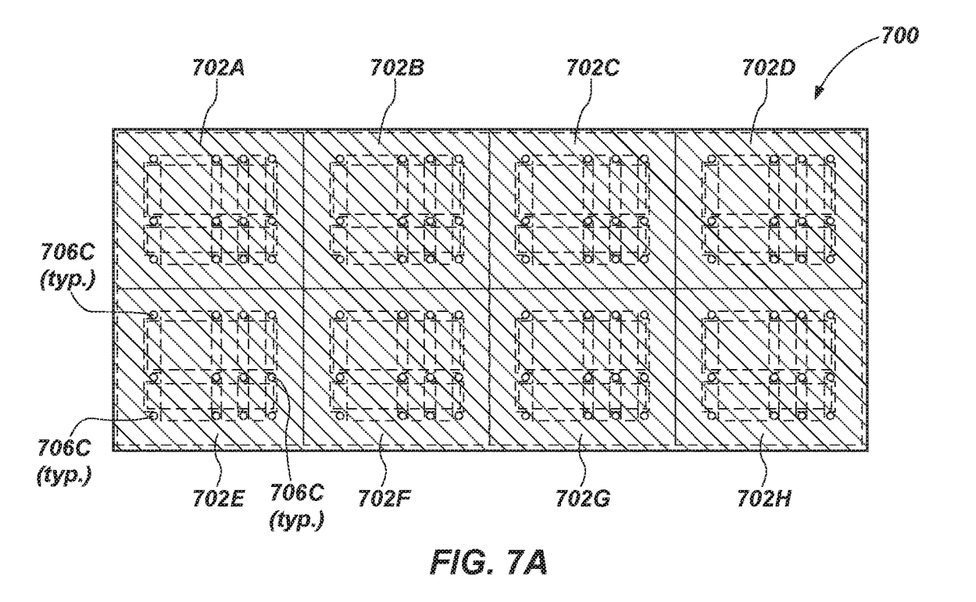
FIG. 7A-B depict schematic representations of example stages in an optional manufacturing process in accordance with the flow chart of FIG. 6.
Figure 7B:
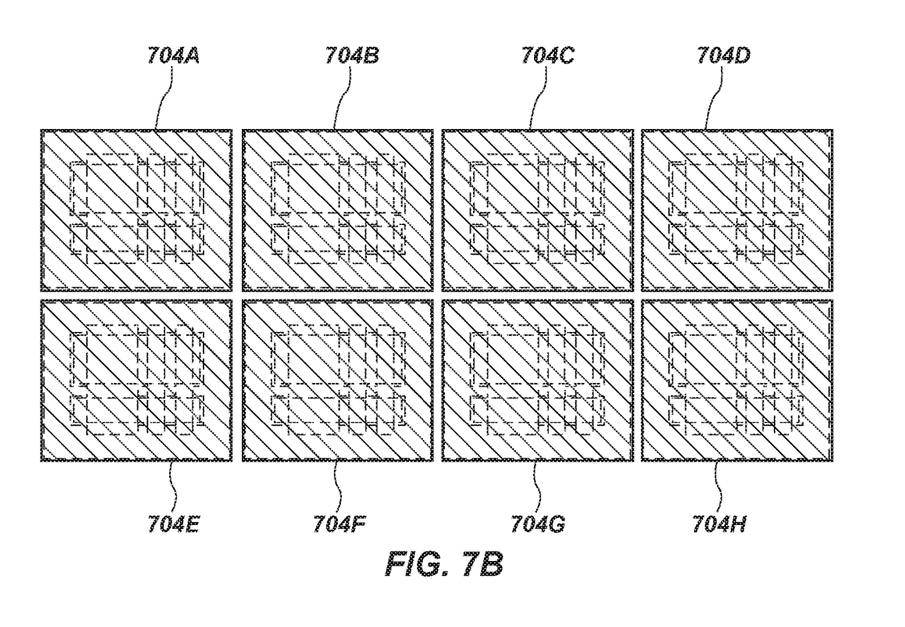

Referring now to FIGS. 7A-B, depict schematic representations of example stages in an optional manufacturing process in accordance with the flow chart of FIG. 6. In some example process flows, the microelectronic device packages may be formed through strip processing, wherein a number of substrates are formed as a unit, indicated generally at 700, and individually at regions 702A-H. The die of each device package are then stacked on each respective substrate region 702A-H as described above. In the depicted example, the die structure of FIGS. 4A-D, is depicted in phantom. Once the stacked die assembly for each substrate region 702A-H is complete, any desired retention material, such as an encapsulant (as indicated by superimposed crosshatching) may be added. The device packages 704A-H may then be singulated as depicted in FIG. 7B.

Regions 702A-H depict an example construction in which openings, indicated typically at 706, are defined to the exterior of the die therein and/or in the regions of one or more of the defined gaps between the die, as described above. Numerous possible locations for openings 706 are depicted. For example, openings 706 are depicted in possible locations proximate the exterior of the stacked die structure, and also at the overlapping junctions of at least one of gaps 418, 426, 432 and 438. Openings 706 can each extend to a respective desired location proximate to one or more layers of the stacked die therein. Openings 706 can be similar to open regions 304 in FIGS. 3A and 3B, may be formed, for example, by laser drilling or an etching process. As discussed relative to FIGS. 3A-B, openings 706 assist in further improving thermal dissipation of the stacked die package. Openings 706 can be left open, or may be filled with a thermally conductive material, such as a thermal paste; which can be deposited, for example, through a paste printing process. Also as discussed relative to FIGS. 3A-B, openings 706 (and any thermally conductive material therein) may connect to the environment external to device packages 704A-H such as a heat spreader, cooling system and/or a thermally conductive surface of the device package or an external structure.

As noted earlier, many types of microelectronic devices beneficially be formed in the alternating stacked die configuration as described herein. One example of such a beneficial combination is a processor coupled in a stacked die package with other devices to form an integrated microelectronic device. With the techniques described herein, devices can be of different configurations and/or dimensions. The resulting microelectronic device package may then be included in a larger electronic device or system.

Figure 8:
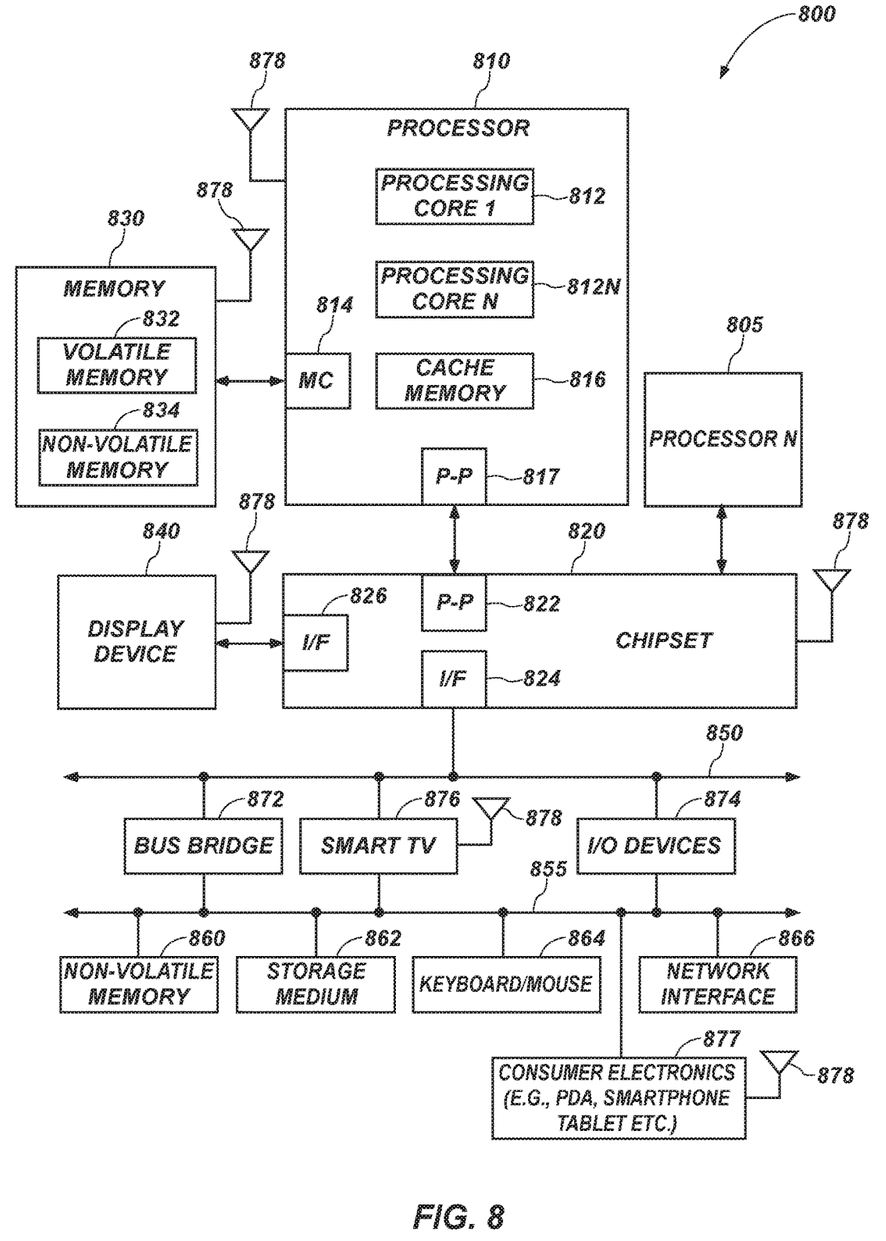
FIG. 8 is block diagram of an electronic system in accordance with some embodiments of the invention.

FIG. 8 illustrates a system level diagram, according to one embodiment of the invention. For instance, FIG. 8 depicts an example of an electronic device (e.g., system) including the microelectronic device package stacked die arranged as described in the present disclosure. FIG. 8 is included to show an example of a higher level device application for the present invention. In one embodiment, system 800 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 800 is a system on a chip (SOC) system.

In one embodiment, processor 810 has one or more processing cores 812 and 812N, where 812N represents the Nth processor core inside processor 810 where N is a positive integer. In one embodiment, system 800 includes multiple processors including 810 and 805, where processor 805 has logic similar or identical to the logic of processor 810. In some embodiments, processing core 812 includes, but is not limited to, pre-fetch logic to fetch instructions, decode logic to decode the instructions, execution logic to execute instructions and the like. In some embodiments, processor 810 has a cache memory 816 to cache instructions and/or data for system 800. Cache memory 816 may be organized into a hierarchal structure including one or more levels of cache memory.

In some embodiments, processor 810 includes a memory controller 814, which is operable to perform functions that enable the processor 810 to access and communicate with memory 830 that includes a volatile memory 832 and/or a non-volatile memory 834. In some embodiments, processor 810 is coupled with memory 830 and chipset 820. Processor 810 may also be coupled to a wireless antenna 878 to communicate with any device configured to transmit and/or receive wireless signals. In one embodiment, the wireless antenna interface 878 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 832 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 834 includes, but is not limited to, flash memory, phase change memory (PCM), read-only memory (ROM), electrically erasable programmable read-only memory (EEPROM), or any other type of non-volatile memory device.

Memory 830 stores information and instructions to be executed by processor 810. In one embodiment, memory 830 may also store temporary variables or other intermediate information while processor 810 is executing instructions. In the illustrated embodiment, chipset 820 connects with processor 810 via Point-to-Point (PtP or P-P) interfaces 817 and 822. Chipset 820 enables processor 810 to connect to other elements in system 800. In some embodiments of the invention, interfaces 817 and 822 operate in accordance with a PtP communication protocol such as the Intel® QuickPath Interconnect (QPI) or the like. In other embodiments, a different interconnect may be used.

In some embodiments, chipset 820 is operable to communicate with processor 810, 805N, display device 840, and other devices 872, 876, 874, 860, 862, 864, 866, 877, etc. Chipset 820 may also be coupled to a wireless antenna 878 to communicate with any device configured to transmit and/or receive wireless signals.

Chipset 820 connects to display device 840 via interface 826. Display 840 may be, for example, a liquid crystal display (LCD), a plasma display, cathode ray tube (CRT) display, or any other form of visual display device. In some embodiments of the invention, processor 810 and chipset 820 are merged into a single SOC. In addition, chipset 820 connects to one or more buses 850 and 855 that interconnect various elements 874, 860, 862, 864, and 866. Buses 850 and 855 may be interconnected together via a bus bridge 872. In one embodiment, chipset 820 couples with a non-volatile memory 860, a mass storage device(s) 862, a keyboard/mouse 864, and a network interface 866 via interface 824 and/or 804, smart TV 876, consumer electronics 877, etc.

In one embodiment, mass storage device 862 includes, but is not limited to, a solid state drive, a hard disk drive, a universal serial bus flash memory drive, or any other form of computer data storage medium. In one embodiment, network interface 866 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 8 are depicted as separate blocks within the system 800, the functions performed by some of these blocks may be integrated within a single semiconductor circuit or may be implemented using two or more separate integrated circuits. For example, although cache memory 816 is depicted as a separate block within processor 810, cache memory 816 (or selected aspects of 816) can be incorporated into processor core 812.

To better illustrate the methods and apparatuses described herein, a non-limiting set of example embodiments are set forth below as numerically identified examples:

Example 1 is a microelectronic device, including: a substrate; first and second semiconductor die supported by the substrate in laterally spaced relation to one another defining a first gap extending in a first direction; third and fourth semiconductor die extending over the first and second semiconductor die and in laterally spaced relation to one another defining a second gap extending in a second direction angularly offset from the first direction of the first gap.

In Example 2, the subject matter of Example 1 where the second gap extends perpendicular to the first gap.

In Example 3, the subject matter of any one or more of Examples 1-2 where the first and second semiconductor die are directly connected to the substrate.

In Example 4, the subject matter of any one or more of Examples 1-3 where the third and fourth semiconductor die each extend across and is connected to each of said first and second die.

In Example 5, the subject matter of any one or more of Examples 1-4 optionally including fifth and sixth semiconductor die extending over the third and fourth semiconductor die and in laterally spaced relation to one another, defining a third gap extending in a third direction angularly offset from at least one of the first and second directions.

In Example 6, the subject matter of Example 5 where the third direction and the first direction are the same.

In Example 7, the subject matter of any one or more of Examples 1-6 where one of the first and second gaps extends vertically adjacent a thermally active region of at least one die.

In Example 8, the subject matter of any one or more of Examples 1-7 optionally including an encapsulant substantially encasing the semiconductor die.

In Example 9, the subject matter of Example 8 optionally including at least one opening extending through the encapsulant to an internal region of the device.

In Example 10, the subject matter of Example 9 optionally including a thermally conductive material within the opening.

In Example 11, the subject matter of Example 10 optionally including a thermal distribution structure in thermal communication with the thermally conductive material within the opening.

In Example 12, the subject matter of Example 11 where the thermal distribution structure includes a metallic structure.

In Example 13, the subject matter of Example 12 where the thermal distribution structure includes a metallic structure formed on the surface of the device.

In Example 14, the subject matter of any one or more of Examples 1-13 where at least one die includes multiple vertical interconnects electrically coupling respective contacts of another die above such die, to contacts extending below such die.

In Example 15, the subject matter of Example 14 where the multiple vertical interconnects comprise multiple through-silicon vias.

In Example 16, the subject matter of any one or more of Examples 1-15 where the substrate is the package substrate.

In Example 17, the subject matter of any one or more of Examples 1-16 where one die is a processor.

In Example 18, the subject matter of any one or more of Examples 1-17 where at least one die is a memory device.

In Example 19, the subject matter of any one or more of Examples 1-18 where at least one of the die is a bridge device providing interconnects between at least two other die.

Example 20 is a microelectronic device, including a substrate; and multiple layers of semiconductor die supported by the substrate, the multiple layers including first and second layers that each include at least two die in spaced relation to one another to define a respective gap between the die; and where the gap between die in the first layer extends in a first direction, and where the gap between die in the second layer extends in a second direction angularly offset from the first direction.

In Example 21, the subject matter of Example 20 where the gap between die extending in the second direction extends perpendicular to the gap between die extending in the first direction.

In Example 22, the subject matter of any one or more of Examples 20-21 where the multiple layers of semiconductor die further includes a third layer of semiconductor die above the second layer of the multiple layers, the third layer of semiconductor die including at least two die in spaced relation to one another to define a gap between such die; and where the gap between the at least two die in the third layer extends in the first direction.

In Example 23, the subject matter of any one or more of Examples 20-22 where the first layer includes first and second semiconductor die; and where each of the multiple die of the second layer extends across and is connected to each of said first and second die.

In Example 24, the subject matter of any one or more of Examples 20-23 where the multiple die of at least one layer of the multiple layers are arranged to provide a gap between die that extends adjacent a high thermal activity region of at least one die in a vertically adjacent layer.

In Example 25, the subject matter of any one or more of Examples 20-24 where at least one layer of the multiple layers includes at least first, second, and third die arranged to define two gaps between laterally adjacent die, the two gaps extending in parallel to one another.

In Example 26, the subject matter of any one or more of Examples 20-25 where one die is a processor.

In Example 27, the subject matter of any one or more of Examples 20-26 where at least one die is a memory device.

In Example 28, the subject matter of Example 27 where all die in of least one layer of the multiple layers are memory devices.

In Example 29, the subject matter of any one or more of Examples 26-28 where the processor is in an intermediate layer of the multiple layers.

In Example 30, the subject matter of any one or more of Examples 26-29 where the processor is in a layer above the lowermost layer of the multiple layers.

In Example 31, the subject matter of any one or more of Examples 20-30 where at least one of the die is a bridge device providing interconnects between at least two other die.

In Example 32, the subject matter of Example 31 where the at least two other die interconnected by the bridge device are both in the same layer.

In Example 33, the subject matter of Example 32 where the bridge device is in an adjacent layer to the layer containing the die interconnected by the bridge device.

In Example 34, the subject matter of any one or more of Examples 20-33 where the die of the first layer include vertical interconnects providing electrical communication between the die of the second layer and the substrate.

Example 35 is a method of manufacturing a microelectronic device, including: attaching multiple semiconductor die to a substrate to form a base layer of die, the multiple die of the base layer arranged in a first orientation, where the multiple die are in laterally spaced relation to one another to define at least one gap extending in a first direction; attaching multiple semiconductor die to the multiple die of the base layer to form a second layer of die, the multiple die of the second layer arranged in a second orientation, where the multiple die are in laterally spaced relation to one another to define at least one gap extending in a second direction angularly offset from the first direction.

In Example 36, the subject matter of Example 35 optionally includes attaching contact balls to the substrate.

In Example 37, the subject matter of any one or more of Examples 35-36 optionally including a retention material to at least some die of the multiple semiconductor die of each of the first and second layers.

In Example 38, the subject matter of Example 37 where the retention material includes an underfill material.

In Example 39, the subject matter of any one or more of Examples 37-38 where the retention material includes an encapsulant material.

In Example 40, the subject matter of any one or more of Examples 37-39 optionally including an encapsulant substantially encasing the semiconductor die.

In Example 41, the subject matter of Example 40 optionally includes forming at least one opening extending through the encapsulant to an internal region of the device.

In Example 42, the subject matter of Example 41 optionally includes forming a thermally conductive material within the opening.

In Example 43, the subject matter of Example 42 optionally includes forming a thermal distribution structure in thermal communication with the thermally conductive material within the opening.

In Example 44, the subject matter of Example 43 where the thermal distribution structure includes a metallic structure.

In Example 45, the subject matter of Example 44 where the thermal distribution structure includes a metallic structure formed on the surface of the device.

In Example 46, the subject matter of any one or more of Examples 35-45 where the second direction is perpendicular to the first direction.

In Example 47, the subject matter of any one or more of Examples 35-46 optionally include attaching multiple semiconductor die to the multiple die of the second layer to form a third layer of die, the multiple die of the third layer arranged in laterally spaced relation to one another to define at least one gap extending in the first direction.

In Example 48, the subject matter of any one or more of Examples 35-47 where at least one die of the multiple die of one layer is a processor.

In Example 49, the subject matter of any one or more of Examples 35-48 where at least one die of the multiple die of one layer is a memory device.

In Example 50, the subject matter of Example 49 where all die of least one layer are memory devices.

In Example 51, the subject matter of any one or more of Examples 35-50 where at least one of the gaps formed between die in a layer extends adjacent a thermally active region of at least one die in an adjacent layer.

In Example 52, the subject matter of Example 51 where the thermally active region is a region of a processor.

In Example 53, the subject matter of any one or more of Examples 35-52 where at least one die includes multiple vertical interconnects electrically coupling respective contacts of another die in a layer above the at least one die, to contacts extending below the at least one die.

In Example 54, the subject matter of Example 53 where attaching the multiple die of the second layer to the multiple die of the first layer includes establishing an electrical connection between at least one die of the second layer and the substrate through vertical interconnects in at least one die of the base layer.

Example 55 is an electronic system, including: a microelectronic device, including, a substrate, a first semiconductor die layer including first and second semiconductor die supported by the substrate in laterally spaced relation to one another defining a first gap extending in a first direction, a second semiconductor die layer including third and fourth semiconductor die extending over the first and second semiconductor die and in laterally spaced relation to one another defining a second gap extending in a second direction perpendicular to the first direction of the first gap; and at least one of a mass storage device and a network interface operably coupled to the microelectronic device.

In Example 56, the subject matter of Example 55 where at least one of the first, second, third, and fourth semiconductor die is a processor.

In Example 57, the subject matter of any one or more of Examples 55-56 where at least one of the first, second, third, and fourth semiconductor die is a memory device.

In Example 58, the subject matter of any one or more of Examples 55-57 where the first and second semiconductor die are coupled directly to the substrate.

In Example 59, the subject matter of any one or more of Examples 55-58 optionally including a third semiconductor die layer including fifth and sixth semiconductor die extending over the third and fourth semiconductor die and in laterally spaced relation to one another defining a third gap extending in the first direction.

In Example 60, the subject matter of any one or more of Examples 55-59 where at least one of the semiconductor die layers includes an additional semiconductor die.

In Example 61, the subject matter of any one or more of Examples 55-60 where one of the defined gaps in one of the layers extends adjacent a thermally active region of at least one die in a vertically adjacent layer.

In Example 62, the subject matter of any one or more of Examples 55-61 where at least one of the die is a bridge device providing interconnects between at least two other die.

In Example 63, the subject matter of Example 62 where the at least two other die interconnected by the bridge device are both in the same layer.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A microelectronic device, comprising:
a substrate;
first and second semiconductor die supported by the substrate in laterally spaced relation to one another defining a first gap extending in a first direction;
third and fourth semiconductor die extending over the first and second semiconductor die and in laterally spaced relation to one another defining a second gap extending in a second direction angularly offset from the first direction of the first gap; and
fifth and sixth semiconductor die extending over the third and fourth semiconductor die and in laterally spaced relation to one another defining a third gap extending in a third direction angularly offset from the second direction, wherein the third direction and the first direction are the same.

2. The microelectronic device of claim 1, wherein the second gap extends perpendicular to the first gap.

3. The microelectronic device of claim 1, wherein the first and second semiconductor die are directly connected to the substrate.

4. The microelectronic device of claim 1, wherein the third and fourth semiconductor die each extend across and is connected to each of said first and second die.

5. The microelectronic device of claim 1, wherein one of the first and second gaps extends vertically adjacent a thermally active region of at least one die.

6. The microelectronic device of claim 1, wherein at least one die includes multiple vertical interconnects electrically coupling respective contacts of another die above such die, to contacts extending below such die.

7. The microelectronic device of claim 6, wherein the multiple vertical interconnects comprise multiple through-silicon vias.

8. The microelectronic device of claim 1, wherein the substrate is a package substrate.

9. A microelectronic device, comprising
a substrate; and
multiple layers of semiconductor die supported by the substrate, the multiple layers including,
first and second layers that each include at least two die in spaced relation to one another to define a respective gap between the die, and
a third layer of semiconductor die above the second layer of the multiple layers, the third layer of semiconductor die including at least two die in spaced relation to one another to define a gap between such die; and
wherein the gap between die in the first layer extends in a first direction, wherein the gap between die in the second layer extends in a second direction angularly offset from the first direction, and wherein the gap between the at least two die in the third layer extends in the first direction.

10. The microelectronic device of claim 9, wherein at least one layer of the multiple layers comprises at least first, second, and third die arranged to define two gaps between laterally adjacent die, the two gaps extending in parallel to one another.

11. An electronic system, comprising:
a microelectronic device, comprising,
a substrate,
a first semiconductor die layer including first and second semiconductor die supported by the substrate in laterally spaced relation to one another defining a first gap extending in a first direction,
a second semiconductor die layer including third and fourth semiconductor die extending over the first and second semiconductor die and in laterally spaced relation to one another defining a second gap extending in a second direction perpendicular to the first direction of the first gap;
a third semiconductor die layer including fifth and sixth semiconductor die extending over the third and fourth semiconductor die and in laterally spaced relation to one another defining a third gap extending in the first direction; and
at least one of a mass storage device and a network interface operably coupled to the microelectronic device.

12. The electronic system of claim 11, wherein the first and second semiconductor die are coupled directly to the substrate.

13. The electronic system of claim 11, wherein one of the defined gaps in one of the layers extends adjacent a thermally active region of at least one die in a vertically adjacent layer.

14. The microelectronic device of claim 9, wherein at least one die includes multiple vertical interconnects electrically coupling respective contacts of another die above such die, to contacts extending below such die.

15. The electronic system of claim 11, wherein the microelectronic device includes at least one die including multiple vertical interconnects electrically coupling respective contacts of another die above such die, to contacts extending below such die.

* * * * *